United States Patent
Chi et al.

(10) Patent No.: US 9,478,626 B2
(45) Date of Patent: Oct. 25, 2016

(54) SEMICONDUCTOR DEVICE WITH AN INTERCONNECT STRUCTURE AND METHOD FOR FORMING THE SAME

(71) Applicant: Taiwan Semiconductor Manufacturing Co., Ltd, Hsin-Chu (TW)

(72) Inventors: Guo-Chiang Chi, Zhubei (TW); Chia-Der Chang, Hsinchu (TW); Chih-Hung Lu, Zhudong Township (TW); Wei-Chin Chen, Keelung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/576,497

(22) Filed: Dec. 19, 2014

(65) Prior Publication Data

US 2016/0181386 A1    Jun. 23, 2016

(51) Int. Cl.
| | |
|---|---|
| H01L 21/02 | (2006.01) |
| H01L 29/45 | (2006.01) |
| H01L 29/49 | (2006.01) |
| H01L 29/06 | (2006.01) |
| H01L 29/78 | (2006.01) |
| H01L 21/28 | (2006.01) |
| H01L 21/311 | (2006.01) |
| H01L 21/3213 | (2006.01) |

(52) U.S. Cl.
CPC ......... *H01L 29/45* (2013.01); *H01L 21/28079* (2013.01); *H01L 21/31111* (2013.01); *H01L 21/32134* (2013.01); *H01L 21/32135* (2013.01); *H01L 29/0642* (2013.01); *H01L 29/495* (2013.01); *H01L 29/78* (2013.01)

(58) Field of Classification Search
CPC .................... H01L 21/7682; H01L 21/76895; H01L 21/76879; H01L 23/53238; H01L 27/0629; H01L 29/7816; H01L 29/66765
USPC ....................................................... 257/729
See application file for complete search history.

(56) References Cited

U.S. PATENT DOCUMENTS

| | | | | |
|---|---|---|---|---|
| 5,334,862 A | * | 8/1994 | Manning | H01L 29/66765 257/330 |
| 5,545,581 A | | 8/1996 | Armacost et al. | |
| 6,344,389 B1 | * | 2/2002 | Bronner | H01L 21/76807 257/E21.579 |
| 6,642,563 B2 | * | 11/2003 | Kanaya | H01L 21/28273 257/295 |
| 6,713,835 B1 | * | 3/2004 | Horak | H01L 21/7682 257/522 |
| 7,741,676 B2 | * | 6/2010 | Hashimoto | H01L 29/66727 257/330 |
| 7,902,581 B2 | * | 3/2011 | Frohberg | H01L 21/76877 257/296 |
| 8,247,296 B2 | * | 8/2012 | Grivna | H01L 29/407 257/E21.41 |

(Continued)

FOREIGN PATENT DOCUMENTS

| | | |
|---|---|---|
| DE | 102014119164 A1 | 7/2015 |
| KR | 10-0196018 B1 | 6/1999 |
| KR | 10-2000-0014004 A | 3/2000 |

*Primary Examiner* — Michael Lebentritt
(74) *Attorney, Agent, or Firm* — Birch, Stewart, Kolasch & Birch, LLP

(57) ABSTRACT

A semiconductor device structure and method for forming the semiconductor device structure are provided. The semiconductor device structure includes a substrate and a gate electrode formed on the substrate. The semiconductor device structure also includes a first contact structure including a first portion and a second portion. The first portion of the first contact structure is formed in the gate electrode, and the second portion is formed on the first portion.

19 Claims, 6 Drawing Sheets

(56) References Cited

U.S. PATENT DOCUMENTS

| | | | |
|---|---|---|---|
| 8,415,739 B2* | 4/2013 | Venkatraman | H01L 29/407 257/330 |
| 8,569,132 B2* | 10/2013 | Machida | H01L 29/66068 257/329 |
| 9,105,606 B2* | 8/2015 | Cheng | H01L 21/28079 |
| 9,214,541 B2* | 12/2015 | Ramachandran | H01L 21/76895 |
| 9,269,585 B2 | 2/2016 | Suen et al. | |
| 2007/0052095 A1* | 3/2007 | Torii | H01L 23/5226 257/737 |
| 2009/0261421 A1* | 10/2009 | Gogoi | H01L 29/7816 257/378 |
| 2010/0224925 A1* | 9/2010 | Ching | H01L 27/0629 257/301 |
| 2013/0020623 A1* | 1/2013 | Tsui | H01L 27/11519 257/300 |
| 2013/0069174 A1 | 3/2013 | Chuang et al. | |
| 2014/0252620 A1* | 9/2014 | Huang | H01L 23/53238 257/751 |
| 2015/0115329 A1* | 4/2015 | Lin | H01L 21/76895 257/211 |
| 2015/0118837 A1* | 4/2015 | Shieh | H01L 21/76879 438/586 |
| 2015/0235940 A1* | 8/2015 | Chen | H01L 23/528 257/759 |
| 2015/0348917 A1* | 12/2015 | Tsai | H01L 23/585 257/774 |

\* cited by examiner

US 9,478,626 B2

SEMICONDUCTOR DEVICE WITH AN INTERCONNECT STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line.

In the semiconductor manufacturing process, an interconnect structure is used to form connections between devices. With more and more devices on a chip with high integrity, the early-stage single-layer metallization process had been improved to form multiple layers of connections. Two layers, three layers, or even four layers of connections are formed in the semiconductor devices.

Although existing interconnect structures have been generally adequate for their intended purposes, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
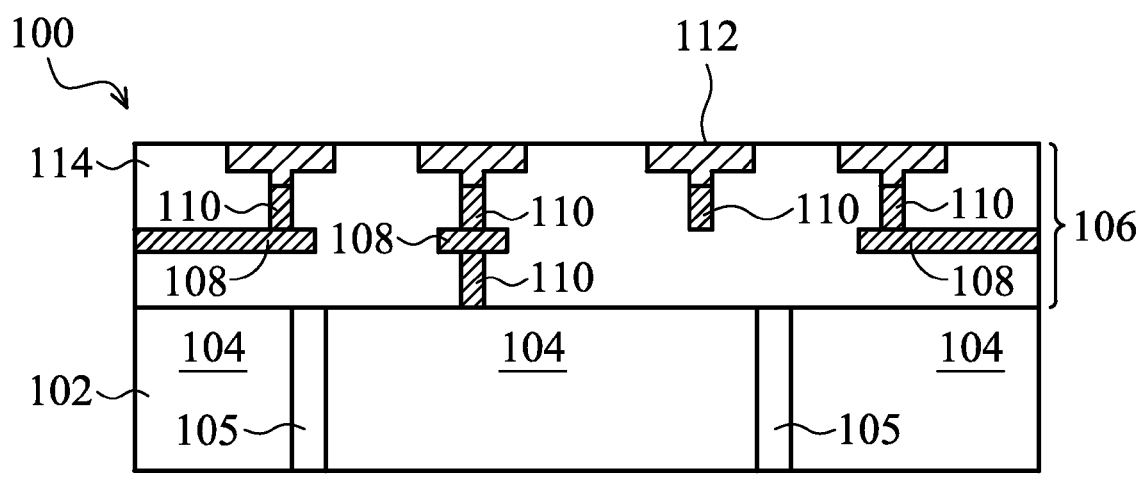
FIG. 1 shows a cross-sectional representation of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments of a semiconductor device structure with an interconnect structure are provided. The interconnect structure involves several metal types in one insulating layer and includes a number of contact structures which are stacked on a substrate. The interface between two contact structures should be clean to ensure a good electrical connection between the two contact structures. Therefore, the disclosure provides a cleaning process to clean the interface between the two contact structures.

FIG. 1 shows a cross-sectional representation of a semiconductor device structure 100, in accordance with some embodiments. The semiconductor device structure 100 includes an interconnect structure 106 formed on a substrate 102.

The substrate 102 may be made of silicon or other semiconductor materials. Alternatively or additionally, the substrate 102 may include other elementary semiconductor materials such as germanium (Ge). In some embodiments, the substrate 102 is made of a compound semiconductor such as silicon carbide (SiC), gallium arsenic (GaAs), indium arsenide (InAs), or indium phosphide (InP). In some embodiments, the substrate 102 is made of an alloy semiconductor such as silicon germanium (SiGe), silicon germanium carbide (SiGeC), gallium arsenic phosphide (GaAsP), or gallium indium phosphide (GaInP). In some embodiments, the substrate 102 includes an epitaxial layer. For example, the substrate 102 has an epitaxial layer overlying a bulk semiconductor. In some other embodiments, the substrate 102 may be a silicon-on-insulator (SOI) or a germanium-on-insulator (GOI) substrate.

The substrate 102 includes device regions 104 formed on a top surface of the substrate 102. The device regions 104 may have various device elements. Examples of device elements that are formed in the substrate 102 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the device regions 104 are formed in substrate 102 in a front-end-of-line (FEOL) process. In some embodiments, the substrate 102 further includes through-substrate vias (TSVs) 105 filled with a conductive material(s) that provides connections from the bottom to the top of the substrate 102.

The interconnect structure 106 is formed over the substrate 102, e.g., over the device regions 104. In some embodiments, the interconnect structure 106 is formed in a back-end-of-line (BEOL) process. The interconnect structure 106 includes interconnect structures, such as the conductive lines 108, a first contact structure 110, and a second contact structure 112. In some embodiments, the conductive lines 108, the first contact structure 110, and a second contact structure 112 respectively include conductive materials such as copper (Cu), aluminum (Al), tungsten (W), titanium (Ti), tantalum (Ta), alloys thereof, or combinations thereof.

As shown in FIG. 1, the first contact structure 110 and the second contact structure 112 are formed in an insulating material 114. In other words, the second contact structure 112 and the first contact structure 110 are surrounded by the insulating material 114.

The insulating material 114 is a dielectric material, such as silicon dioxide, silicon oxide, silicon nitride, silicon oxynitride, or undoped silicon glass (USG), phosphorus doped oxide (PSG), boron doped oxide (BSG), or boron phosphorus doped oxide (BPSG). In some embodiments, the insulating layer 114 is formed by plasma-enhanced chemical vapor deposition (PECVD). In some embodiments, the insulating material 114 includes multiple dielectric layers of dielectric materials. However, the interconnect structure 106 shown is merely for illustrative purposes. The interconnect structure 106 may include other configurations and may include one or more conductive lines and via layers.

FIGS. 2A-2I show cross-sectional representations of various stages of forming a semiconductor device structure 200, in accordance with some embodiments of the disclosure.

Figure 2A:
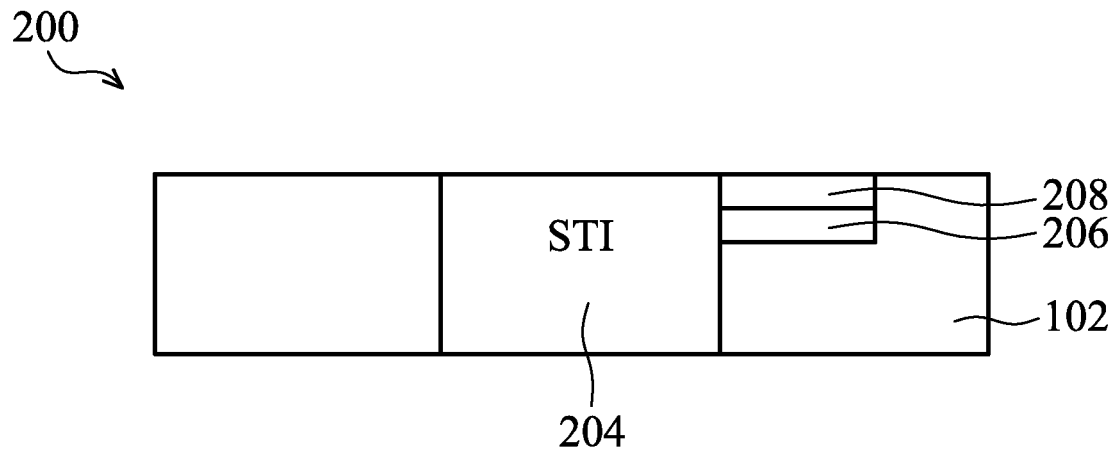
FIGS. 2A-2I show cross-sectional representations of various stages of forming a semiconductor device structure, in accordance with some embodiments of the disclosure.

As shown in FIG. 2A, a substrate 102 is provided. In some embodiments, the substrate 102 is made of silicon (Si) or other semiconductor materials.

The semiconductor device structure 200 further includes an isolation structure 204, such as shallow trench isolation (STI) features or local oxidation of silicon (LOCOS) features. The isolation structure 204 may define and isolate various integrated circuit devices. Integrated circuit devices, such as metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements, are formed in and/or on the substrate 102.

As shown in FIG. 2A, a source/drain (S/D) structure 206 is formed in the substrate 102. In some embodiments, the S/D structure 206 is a strained source/drain structure. In some embodiments, silicon germanium (SiGe) is deposited in the substrate 102 to form a SiGe S/D structure 206. The S/D structure 206 may be in-situ doped or undoped during the epi process. When the S/D structure 206 is undoped, they may be doped in a subsequent process. The doping may be achieved by an ion implantation process, plasma immersion ion implantation (PIII) process, gas and/or solid source diffusion process, or other suitable process. The S/D structure 206 may further be exposed to annealing processes, such as a rapid thermal annealing process. In some embodiments, the S/D structure 206 is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes. The epi process may use gaseous and/or liquid precursors, which may interact with the composition of the substrate 102.

As shown in FIG. 2A, a metal silicide layer 208 is formed on the S/D structure 206. In some embodiments, a metal film is deposited on S/D structure 206 by a deposition process, such as a physical vapor deposition (PVD) process, a chemical vapor deposition (CVD) process, a plating process, an electroless plating process, or another applicable process. Afterwards, a heating operation is then carried out to cause a reaction between the deposited metal film and the S/D structure 206, thereby forming the metal silicide layer 208. The un-reacted portion of the deposited metal film is then removed, for example, by using an etching process. The metal silicide layer 208 has a lower resistance than non-silicided regions, especially in smaller geometries.

Figure 2B:
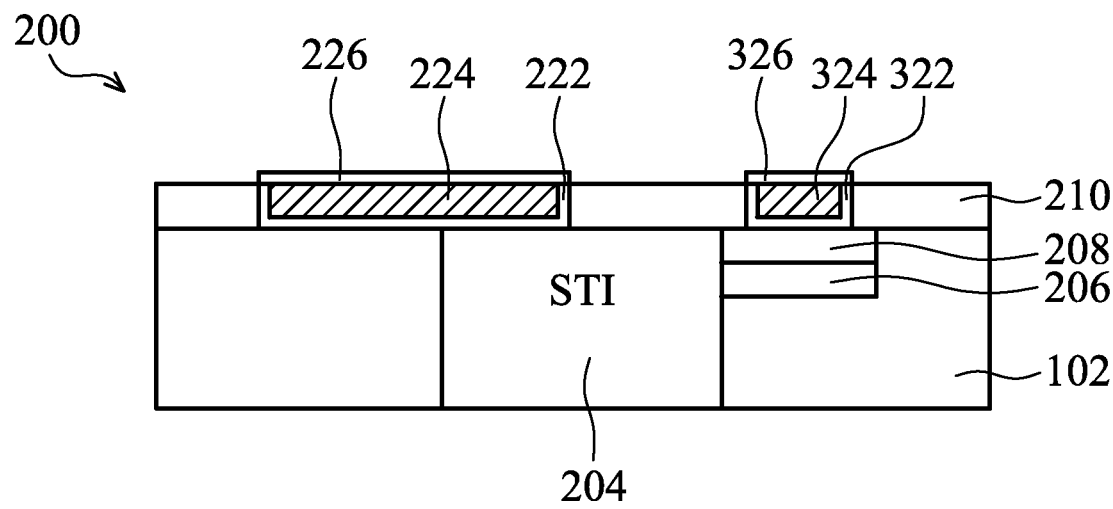

Afterwards, a first dielectric layer 210 is formed on the substrate 102, and a gate dielectric layer 222, a gate electrode 224, a glue layer 322 and a source/drain contact structure (also called S/D contact structure) 324 are formed in the first dielectric layer 210 as shown in FIG. 2B, in accordance with some embodiments of the disclosure.

The first dielectric layer 210 is made of silicon dioxide, silicon oxide, silicon nitride, silicon oxynitride, or other applicable material. The first dielectric layer 210 is formed by chemical vapor deposition (CVD), physical vapor deposition (PVD), or another applicable process.

The gate dielectric layer 222 may be made of silicon oxide, silicon oxynitride, or a high dielectric constant material (high-k material). The high-k material may include hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material.

The gate dielectric layer 222 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, or another suitable process.

The gate electrode 224 is made of conductive material. The conductive material may include metal (e.g., tantalum (Ta), titanium (Ti), molybdenum (Mo), platinum (Pt), aluminum (Al), hafnium (Hf), ruthenium (Ru)), a metal silicide (e.g., titanium silicide, cobalt silicide, nickel silicide, tantalum silicide), or a metal nitride (e.g., titanium nitride, tantalum nitride). In some embodiments, the gate electrode 224 is formed by a chemical vapor deposition (CVD) process, a physical vapor deposition (PVD) process or another applicable process.

The glue layer 322 is formed between the metal silicide layer 208 and the S/D contact structure 324. The glue layer 322 is configured to increase the adhesion strength between the metal silicide layer 208 and the S/D contact structure 324. In some embodiments, the glue layer 322 is made of conductive material, such as cobalt (Co), silver (Ag), aluminum (Al), zinc (Zn), calcium (Ca), gold (Au), magnesium (Mg), tungsten (W), molybdenum (Mo), nickel (Ni), chromium (Cr), another applicable material or combinations thereof. The glue layer 322 is formed by a PVD process, a CVD process, a plasma enhanced CVD (PECVD), a low pressure CVD (LPCVD), or another applicable processes.

The S/D contact structure 324 is made of a conductive material, including but not limited to, copper (Cu), aluminum (Al), tungsten (W), titanium (Ti), alloys thereof, or combinations thereof.

It should be noted that the gate electrode 224 is made of conductive material which tends to form an oxide when it is exposed to an oxygen-containing substance (e.g., air, oxygen-containing precursor, oxygen-containing dielectric layer, oxygen-containing plasma). Therefore, a native metal oxide layer 226 is formed on the gate electrode 224. In addition, the S/D contact structure 324 is also made of conductive material, and a native metal oxide layer 326 is naturally formed on the S/D contact structure 324.

Figure 2C:
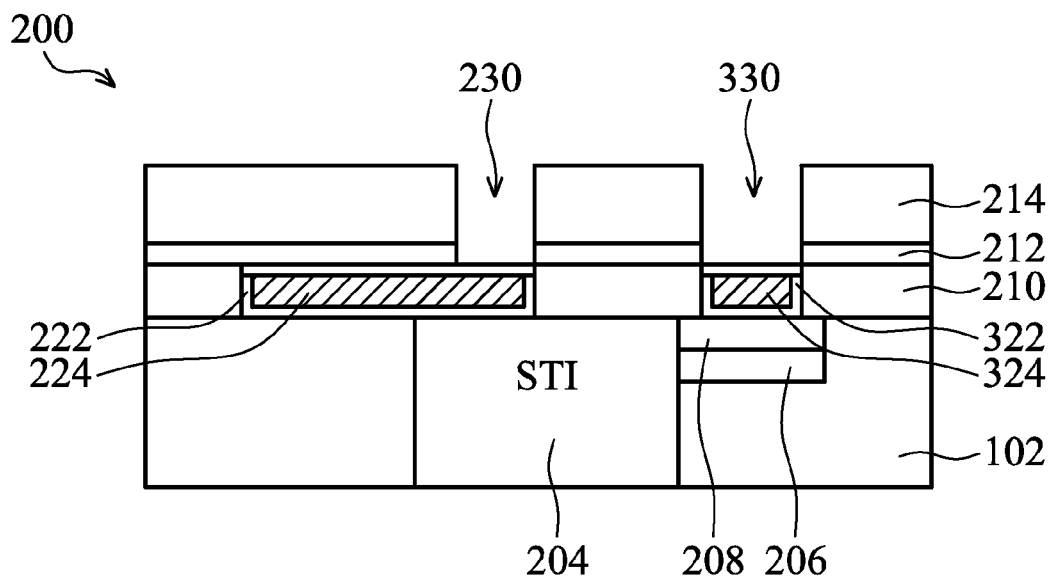
Figure 2D:
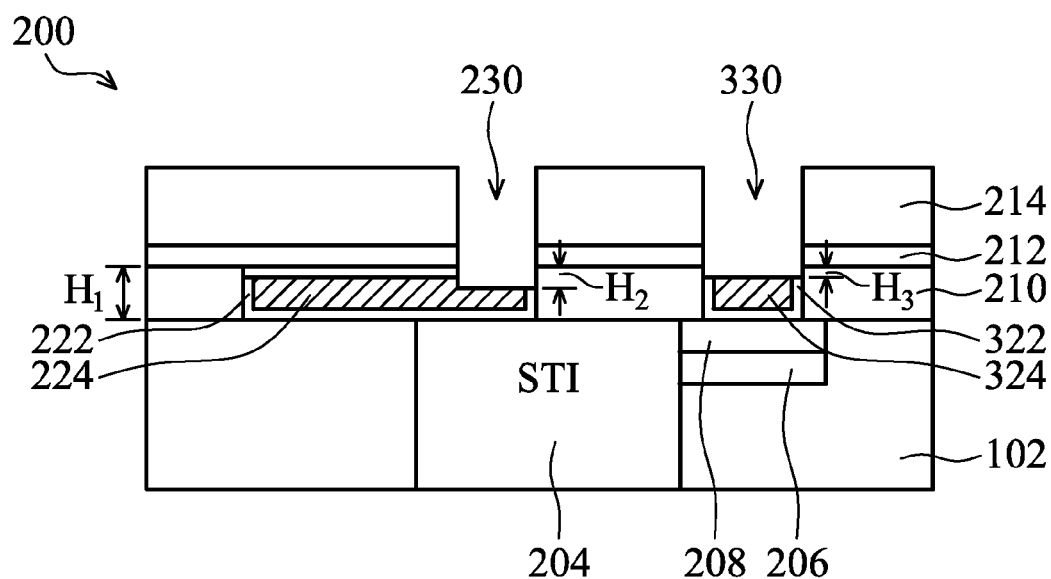
Figure 2E:
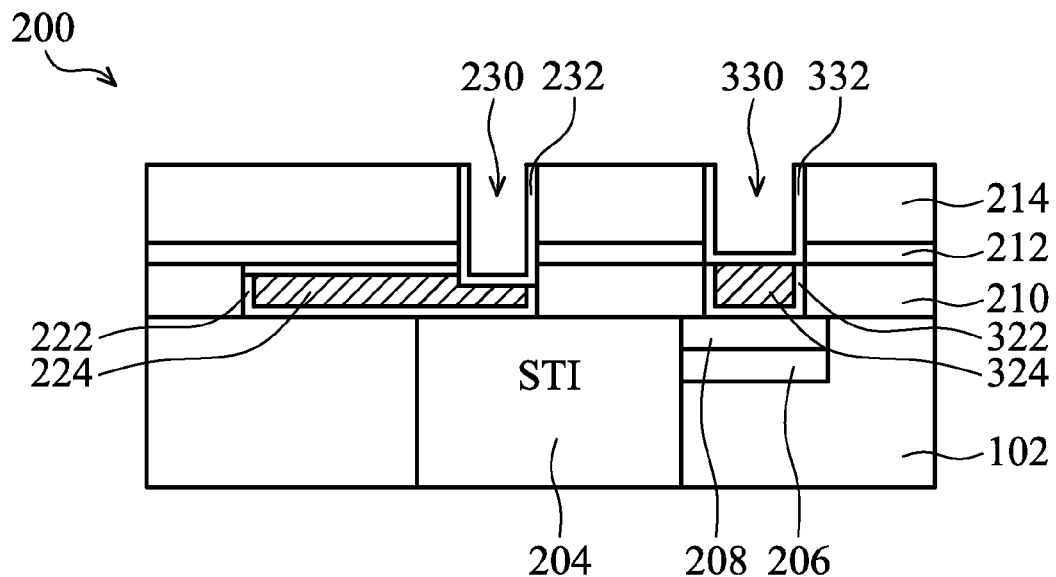
Figure 2F:
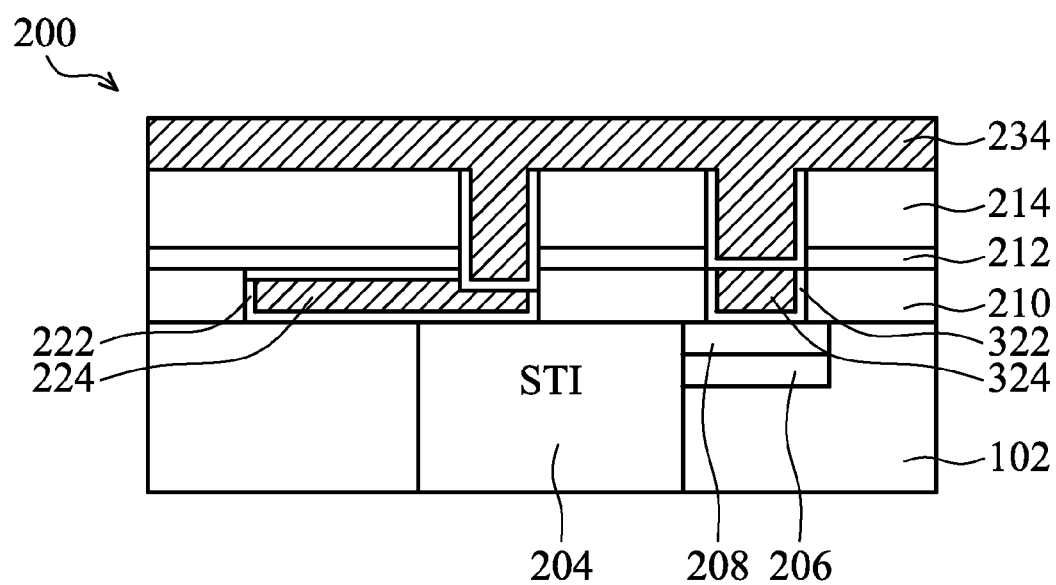
Figure 2G:
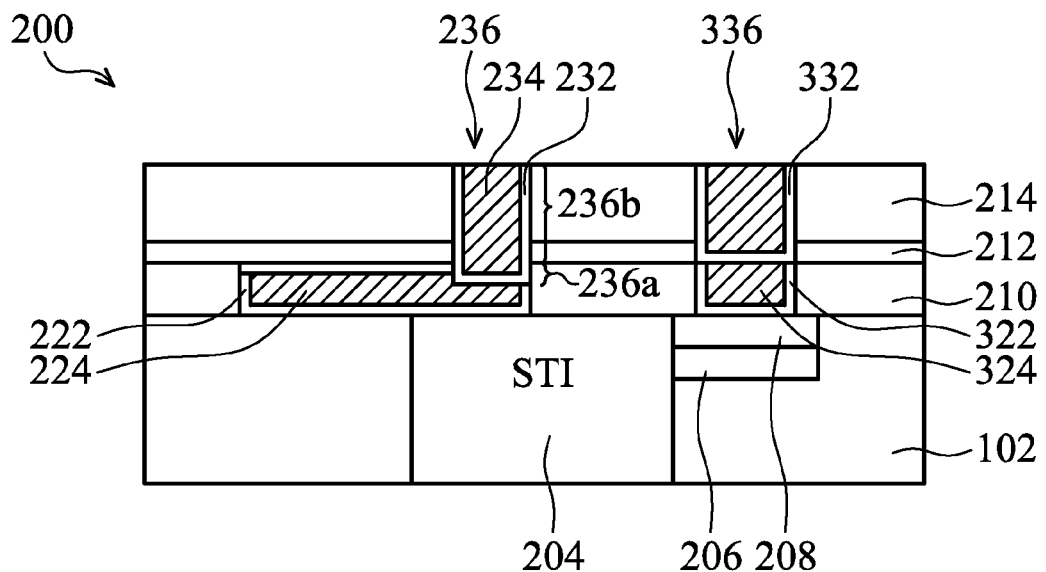

In the subsequent process, a first contact structure 236 (as shown in FIG. 2G) will be formed on the gate electrode 224. However, the native metal oxide layer 226 will block an electrical connection between the gate electrode 224 and the first contact structure 234. More specifically, the native metal oxide layer 226 may cause high contact resistance (Rc) between the gate electrode 224 and the first contact structure 234. In addition, the native metal oxide layer 326 may cause high contact resistance (Rc) between the S/D contact structure 324 and a second S/D contact structure 336 (as shown in FIG. 2G). Therefore, the native metal oxide layer 226 and 326 should be removed.

The gate electrode 224 and the S/D contact structure 324 are made of different material. In some embodiments, the gate electrode 224 is more easily oxidized than the S/D contact structure 324. In some embodiments, the gate electrode 224 is made of aluminum (Al), and the S/D contact structure 324 is made of tungsten (W). In some embodiments, the native metal oxide layer 226 is aluminum oxide (AlOx), and the native metal oxide layer 326 is tungsten oxide ($WO_x$).

After the gate electrode 224 and the S/D contact structure 324 are formed, a second dielectric layer 212 and a third dielectric layer 214 are sequentially formed on the first dielectric layer 210, the gate electrode 224 and the S/D contact structure 324 as shown in FIG. 2C, in accordance with some embodiments of the disclosure.

The second dielectric layer 212 is used as an etching stop layer. The second dielectric layer 212 may be made of silicon nitride, silicon oxynitride or combinations thereof. The third dielectric layer 214 is made of silicon dioxide, silicon oxide, silicon nitride, silicon oxynitride, or another applicable material. In some embodiments, the second dielectric layer 212 is made of silicon nitride (SiNx), and the third dielectric layer 214 is made of silicon oxide (SiOy).

Afterwards, in order to expose the gate electrode 226 and the S/D contact structure 326, a first trench 230 and a second trench 330 are formed in the second dielectric layer 212 and the third dielectric layer 214. However, the native metal oxide layer 226 and 326 covers the gate electrode 226 and the S/D contact structure 326.

In order to remove the native metal oxide layer 226 and 326, a cleaning process is performed on the native metal oxide layer 226 and 326 as shown in FIG. 2D, in accordance with some embodiments of the disclosure.

The cleaning process may be a wet cleaning process or a dry cleaning process. It should be noted that the cleaning process does not just remove the native metal oxide layer 226 and 326, but if also remove a portion of the gate electrode 224 and a portion of the S/D contact structure 324. Therefore, the portion of the gate electrode 224 and the portion of the S/D contact structure 324 are etched.

In some embodiments, the cleaning process is performed by using a wet etching process, and the wet etching process includes using a fluorine-containing acid. In some embodiments, the fluorine-containing acid is hydrofluoric acid (HF). In some embodiments, the fluorine-containing acid has a concentration in a range from about 100 ppm to about 1,000,000 ppm. If the concentration is too low, the native metal oxide layer 226 and 326 may not be completely removed. If the concentration is too high, the gate electrode 224 and the S/D contact structure 324 may be etched too much. Therefore, the performance of the semiconductor device structure may be degraded when the gate electrode 224 and the S/D contact structure 324 are etched too much.

In some embodiments, the wet etching process is performed for a period of time in a range from about 1 second to about 200 seconds. If the time is too short, the native metal oxide layer 226 and 326 may not be completely removed. If the time is too long, the gate electrode 224 and the S/D contact structure 324 may be etched too much.

In some embodiments, the cleaning process is performed by using a dry etching process, and the dry etching process includes using a fluorine-containing gas. In some embodiments, the fluorine-containing gas includes sulfur hexafluoride ($SF_6$), carbon tetrafluoride ($CF_4$), nitrogen trifluoride ($NF_3$), selenium fluoride ($SeF_6$), perfluoroethane ($C_2F_6$), perfluoropropane ($C_3F_8$), another applicable gas or combinations thereof. In some embodiments, a bias voltage used in the plasma process is in a range from about 10 V to about 1000 V. In some embodiments, the flow rate of the fluorine-containing gas is in a range from about 10 sccm to about 500 sccm.

If an argon (Ar) sputtering cleaning process is preformed to remove the native metal oxide layer 226 and 326, the removal rate for removing different metal oxides (such as aluminum oxide (AlOx), and tungsten oxide ($WO_x$)) in the same layer is different. Therefore, the cleaning efficiency is bad. Compared with the Ar sputtering cleaning process, not only the native metal oxide layer 226 on the gate electrode 224, but also the native metal oxide layer 226 on the S/D contact structure 324 are effectively removed by the cleaning process of the disclosure. Therefore, the wet etching process with the fluorine-containing acid or the dry etching process with fluorine-containing gas has a better cleaning efficiency.

As shown in FIG. 2D, the gate electrode 224 has a first height $H_1$, and the recessed height formed by removing the portion of the gate electrode 224 is marked as a second height $H_2$. In some embodiments, a ratio of the second height ($H_2$) to the first height ($H_1$) is in a range from about 0.01 to about 0.5.

In addition, because the gate electrode 224 and the S/D contact structure 324 are made of different materials, the removal amount of the gate electrode 224 and that of the S/D contact structure 324 are different. Another recessed height formed by removing a portion of the S/D contact structure 324 is marked as a third height $H_3$. In some embodiments, the third height $H_3$ is lower than the second height $H_2$.

After the cleaning process, the enlarged first trench 230 and the enlarged second trench 330 are obtained. Afterwards, a glue layer 232 is formed in the enlarged first trench 230, and a glue layer 332 is formed in the enlarged second trench 330 as shown in FIG. 2E, in accordance with some embodiments of the disclosure.

The glue layers 232 and 332 line the sidewall portions and bottom portions of the first trench 230 and the second trench 330, respectively. In some embodiment, the glue layers 232 and 332 are made of a metal or metal alloy layer, respectively. The glue layers 232 and 332 may include cobalt (Co), silver (Ag), aluminum (Al), zinc (Zn), calcium (Ca), gold (Au), magnesium (Mg), tungsten (W), molybdenum (Mo), nickel (Ni), chromium (Cr), or the like. In some embodiment, the glue layers 232 and 332 are by formed by physical vapor deposition (PVD) process, chemical vapor deposition (CVD) process, a plasma enhanced CVD (PECVD) process, low pressure CVD (LPCVD) process, or another applicable process.

After the glue layers 232 and 332 are formed, a first conductive material 234 is filled into the first trench 230, the second trench 330, and on the glue layers 232 and 332 as shown in FIG. 2F, in accordance with some embodiments of the disclosure. In some embodiments, the first conductive material 234 is made of tungsten (W).

Afterwards, a polishing process is used to remove the excess conductive material 234 out of the first trench 230 and the second trench 330 as shown in FIG. 2G, in accordance with some embodiments of the disclosure. In some embodiments, the polishing process is a chemical polishing (CMP) process.

As shown in FIG. 2G, a first contact structure 236 and a second S/D contact structure 336 are formed. The first contact structure 236 includes the first conductive material 234 and the glue layer 232, and the second S/D contact structure 336 includes the first conductive material 234 and the glue layer 332. In some embodiments, the first contact structure 236 and the S/D contact structure 324 are made of the same material.

The first contact structure 236 includes a first portion 236a and a second portion 236b, the first portion 236a is formed in the gate electrode 234, and the second portion 236b is formed on the first portion 236a. In other words, the gate electrode 234 has a recessed portion, and the first portion 236a is formed in the recessed portion.

It should be noted that a bottom surface of the first contact structure 236 is lower than a top surface of the S/D contact structure 324. In other words, the bottom surface of the first contact structure 236 is lower than a bottom surface of the second S/D contact structure 336.

Figure 2H:
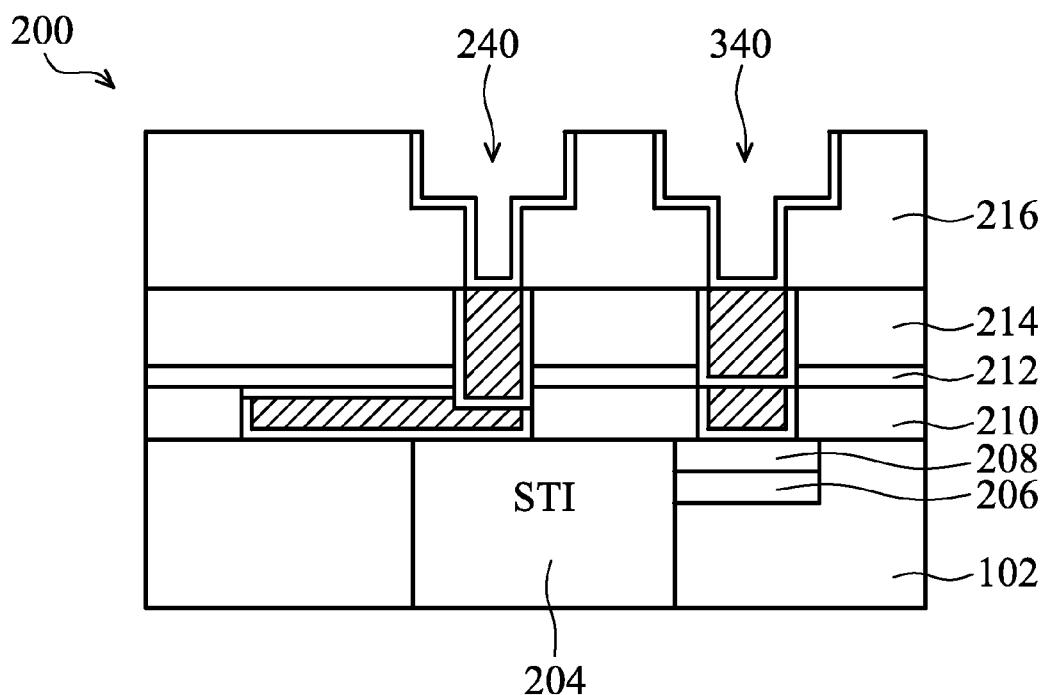

Afterwards, a fourth dielectric layer 216 is formed on the third dielectric layer 214, and a first opening 240 and a second opening 340 are formed in the fourth dielectric layer 216 as shown in FIG. 2H, in accordance with some embodiments of the disclosure. The first opening 240 and the second opening 340 have an upper trench portion and a lower via-hole portion, respectively.

Figure 2I:
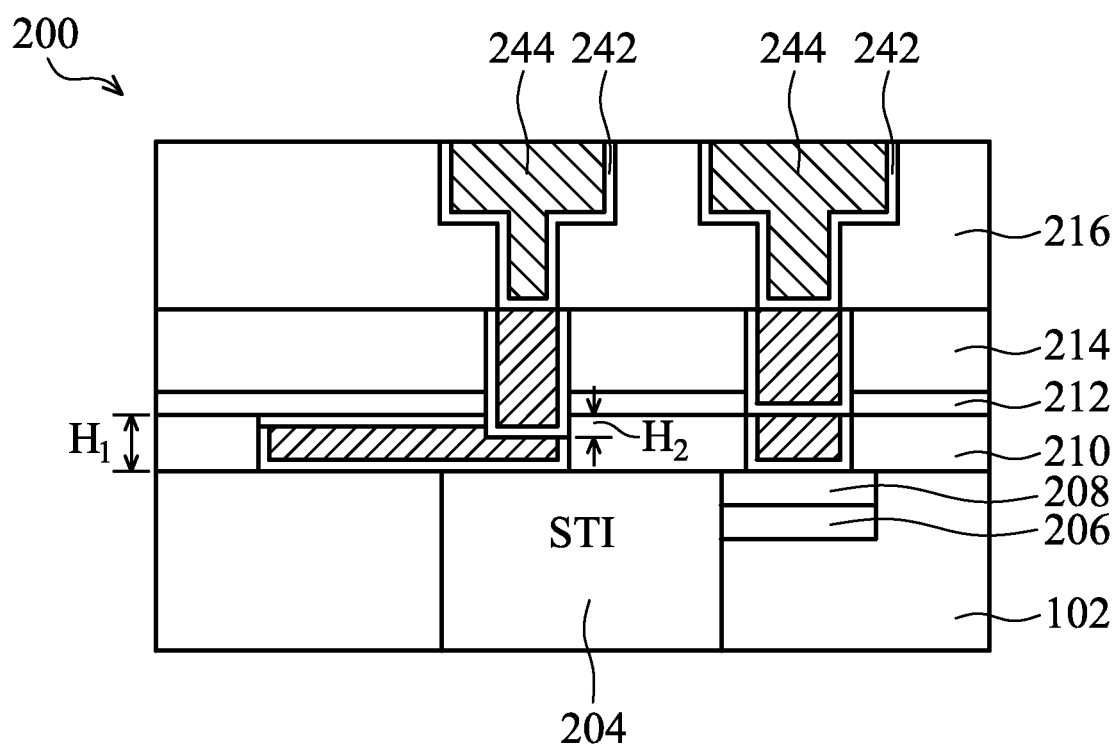

After the first opening 240 and the second opening 340 are formed, a second conductive material 244 is filled into the first opening 240 and the second opening 340 as shown in FIG. 2I, in accordance with some embodiments of the disclosure.

The second conductive material 244 is made of copper (Cu), aluminum (Al), tungsten (W), titanium (Ti), tantalum (Ta), or alloys thereof, or another applicable material. In some embodiments, the second conductive material 244 is made of copper or copper alloy. Due to the concern of metal (such as copper) diffusion in the fourth dielectric layer 214, a diffusion barrier layer 242 is formed under the second conductive material 244 to block copper diffusion, in accordance with some embodiments. However, when the second conductive material 244 is not copper, the diffusion barrier layer 242 is not required. In some embodiments, the diffusion barrier layer 242 is made of titanium (Ti), tantalum (Ta), titanium nitride (TiN), tantalum nitride (TaN), or aluminum nitride (AlN), or multiple layers thereof or combinations thereof. In some embodiments, the diffusion barrier layer 242 is made of a copper diffusion barrier material. In some embodiments, the diffusion barrier layer 242 is made of polymers, such as benzocyclobutene (BCB) polymer.

The disclosure provides a cleaning process to clean the bottom surfaces of the first trench 230 and the second trench 330 (As shown in FIG. 2D). The cleaning process uses a wet etching process including a fluorine-containing acid, or a dry etching process including a fluorine-containing gas. In some embodiments, the cleaning efficiency is controlled by controlling the concentration and time of the fluorine-containing acid. In some other embodiments, the cleaning efficiency is controlled by controlling the flow rate and bias of the fluorine-containing gas. The cleaning efficiency for removing the native metal oxide layer 226 and 326 is improved. Therefore, an interface between the gate electrode 224 and the first contact structure 236 and another interface between the S/D contact structure 324 and second contact structure 336 are cleaned. In addition, although the gate electrode 224 and the S/D contact structure 324 are made of different materials, the native metal oxides formed on them is effectively removed.

Embodiments for forming a semiconductor device structure with an interconnect structure are provided. The interconnect structure includes a first contact structure formed on a gate electrode. The interconnect structure further includes an S/D contact structure formed on an S/D structure, and a second S/D contact formed on the S/D contact structure. The gate electrode and the S/D contact structure are made of different materials. A cleaning process is provided to clean an interface between the contact structure and the gate electrode and another interface between S/D contact structure and the second S/D contact structure. In some embodiments, a wet etching process including a fluorine-containing acid or a dry etching process including a fluorine-containing gas is provided. A portion of the gate electrode is slightly etched by the cleaning process to ensure the native metal oxide is completely removed. Therefore, the high contact resistance (Rc) between the contact structure and the gate electrode is prevented, and the performance of the semiconductor device structure is improved.

In some embodiments, a semiconductor device structure is provided. The semiconductor device structure includes a substrate and a gate electrode formed on the substrate. The semiconductor device structure also includes a first contact structure including a first portion and a second portion. The first portion of the first contact structure is formed in the gate electrode, and the second portion is formed on the first portion.

In some embodiments, a semiconductor device structure is provided. The semiconductor device structure includes a substrate, a gate electrode formed on the substrate, and the gate electrode is made of a first metal. The semiconductor device structure further includes a source/drain (S/D) structure formed in the substrate and a first contact structure formed in and on the gate electrode. The semiconductor device structure also includes a S/D contact structure formed on the S/D structure, the S/D contact structure is made of a second metal, and the first metal is different from the second metal.

In some embodiments, a method for forming a semiconductor device structure is provided. The method includes providing a substrate and forming a gate electrode on the substrate. The method also includes forming a first contact structure in and on the gate electrode. The first contact structure including a first portion and a second portion, the first portion is formed in the gate electrode, and the second portion is formed on the first portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a gate electrode formed on the substrate;
   a first contact structure comprising a first portion and a second portion, wherein the first portion of the first contact structure is formed in the gate electrode, and the second portion is formed on the first portion, and wherein a sidewall of the first portion is aligned with a sidewall of the gate electrode.

2. The semiconductor device structure as claimed in claim 1, wherein the gate electrode has a first height, the first portion of the first contact structure has a second height, and a ratio of the second height to the first height is in a range from about 0.01 to about 0.5.

3. The semiconductor device structure as claimed in claim 1, wherein the gate electrode and the first contact structure are made of different materials.

4. The semiconductor device structure as claimed in claim 1, further comprising:
   a source/drain (S/D) structure formed in the substrate;
   a S/D contact structure formed on the S/D structure, wherein the gate electrode and the S/D contact structure are made of different materials.

5. The semiconductor device structure as claimed in claim 4, wherein the gate electrode is made of aluminum (Al), and the S/D contact structure is made of tungsten (W).

6. The semiconductor device structure as claimed in claim 4, wherein the first contact structure and the S/D contact structure are made of the same material.

7. The semiconductor device structure as claimed in claim 4, wherein a bottom surface of the first contact structure is lower than a top surface of the S/D contact structure.

8. The semiconductor device structure as claimed in claim 4, further comprising:
   an isolation structure formed on the substrate, wherein the isolation structure is formed between the gate electrode and the S/D structure.

9. The semiconductor device structure as claimed in claim 1, wherein the gate electrode is made of aluminum (Al), titanium (Ti), silver (Ag), aluminum (Al), titanium aluminum alloy (TiAl), titanium alumina nitride (TiAlN), tantalum carbide (TaC), tantalum carbon nitride (TaCN), tantalum silicon nitride (TaSiN), manganese (Mn), or zirconium (Zr).

10. A semiconductor device structure, comprising:
    a substrate;
    a gate electrode formed on the substrate, wherein the gate electrode is made of a first metal;
    a source/drain (S/D) structure formed in the substrate;
    a first contact structure formed in and on the gate electrode; and
    an S/D contact structure formed on the S/D structure, wherein the S/D contact structure is made of a second metal, and the first metal is different from the second metal.

11. The semiconductor device structure as claimed in claim 10, wherein the first contact structure comprises a glue layer and a third metal, wherein the third metal is surrounded by the glue layer.

12. The semiconductor device structure as claimed in claim 10, wherein the gate electrode has a first height, and the first contact structure has a first portion formed in the gate electrode, the first portion has a second height, and a ratio of the second height to the first height is in a range from about 0.01 to about 0.5.

13. The semiconductor device structure as claimed in claim 10, further comprising:
    a second S/D contact structure formed on the S/D contact structure, wherein a bottom surface of first contact structure is lower than a bottom surface of the second S/D contact structure.

14. The semiconductor device structure as claimed in claim 10, wherein a bottom surface of the first contact structure is lower than a top surface of the S/D contact structure.

15. The semiconductor device structure as claimed in claim 10, wherein the first metal is more easily oxidized than the second metal.

16. A semiconductor device structure, comprising:
    a substrate;
    a gate electrode formed on the substrate;
    a source/drain (S/D) structure formed in the substrate, wherein a bottom surface of the gate electrode is planar with a top surface of the S/D structure;
    a first S/D contact structure formed on the S/D structure, wherein a portion of a top surface of the gate electrode is lower than a top surface of the first S/D contact structure; and
    an isolation structure formed on the substrate, wherein the isolation structure is formed between the gate electrode and the S/D structure.

17. The semiconductor device structure as claimed in claim 16, wherein the gate electrode is made of aluminum (Al), and the first S/D contact structure is made of tungsten (W).

18. The semiconductor device structure as claimed in claim 16, further comprising:
    a first contact structure formed on the gate electrode, wherein a bottom surface of the first contact structure is lower than the top surface of the first S/D contact structure.

19. The semiconductor device structure as claimed in claim 16, further comprising:
    a second S/D contact structure formed on the first S/D contact structure, wherein a bottom surface of first contact structure is lower than a bottom surface of the second S/D contact structure.

* * * * *